United States Patent
Chuang et al.

(10) Patent No.: US 10,692,848 B2
(45) Date of Patent: Jun. 23, 2020

(54) STRESS REDUCTION APPARATUS AND METHOD

(71) Applicant: Taiwan Semiconductor Manufacturing Company, Ltd., Hsin-Chu (TW)

(72) Inventors: Yao-Chun Chuang, Hsin-Chu (TW); Yu-Chen Hsu, Hsin-Chu (TW); Hao Chun Liu, Hsinchu (TW); Chita Chuang, Hsin-Chu (TW); Chen-Cheng Kuo, Chu-Pei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 76 days.

(21) Appl. No.: 15/018,340

(22) Filed: Feb. 8, 2016

(65) Prior Publication Data

US 2016/0155733 A1 Jun. 2, 2016

Related U.S. Application Data (62) Division of application No. 13/611,226, filed on Sep. 12, 2012, now Pat. No. 9,257,412.

(51) Int. Cl.
*H01L 23/00* (2006.01)
*H01L 25/00* (2006.01)
(Continued)

(52) U.S. Cl.
CPC ............ *H01L 25/50* (2013.01); *H01L 21/563* (2013.01); *H01L 23/3192* (2013.01); *H01L 23/562* (2013.01); *H01L 24/11* (2013.01); *H01L 24/13* (2013.01); *H01L 25/0657* (2013.01); *H01L 24/16* (2013.01); *H01L 2224/0401* (2013.01); *H01L 2224/05022* (2013.01); *H01L 2224/05572* (2013.01); *H01L 2224/10125* (2013.01); *H01L 2224/13022* (2013.01); *H01L 2224/13111* (2013.01); *H01L 2224/13147* (2013.01);
(Continued)

(58) Field of Classification Search
CPC ..................................................... H01L 23/562
USPC .......................................................... 438/107
See application file for complete search history.

(56) References Cited

U.S. PATENT DOCUMENTS

2005/0263855 A1* 12/2005 Fu .......................... H01L 23/544
257/620
2008/0073784 A1 3/2008 Lee
(Continued)

FOREIGN PATENT DOCUMENTS

| CN | 102376679 A | 3/2012 |
|---|---|---|
| TW | I256117 | 6/2006 |
| TW | 201115703 | 5/2011 |

*Primary Examiner* — Hsin Yi Hsieh
(74) *Attorney, Agent, or Firm* — Slater Matsil, LLP (57) ABSTRACT

A method comprises depositing a protection layer over a first substrate, wherein the first substrate is part of a first semiconductor die, forming an under bump metallization structure over the protection layer, forming a connector over the under bump metallization structure, forming a first dummy plane along a first edge of a top surface of the first semiconductor die and forming a second dummy plane along a second edge of the top surface of the first semiconductor die, wherein the first dummy plane and the second dummy plane form an L-shaped region.

20 Claims, 4 Drawing Sheets

(51) Int. Cl.
*H01L 21/56* (2006.01)
*H01L 23/31* (2006.01)
*H01L 25/065* (2006.01)

(52) U.S. Cl.
CPC ............ *H01L 2224/14133* (2013.01); *H01L 2224/14135* (2013.01); *H01L 2224/16145* (2013.01); *H01L 2224/73204* (2013.01); *H01L 2225/06513* (2013.01); *H01L 2225/06527* (2013.01); *H01L 2225/06582* (2013.01); *H01L 2924/00014* (2013.01)

(56) References Cited

U.S. PATENT DOCUMENTS

| | | | |
|---|---|---|---|
| 2008/0136004 A1* | 6/2008 | Yang | H01L 24/96 257/686 |
| 2011/0101520 A1 | 5/2011 | Liu et al. | |
| 2011/0210444 A1 | 9/2011 | Jeng et al. | |
| 2011/0260336 A1 | 10/2011 | Kang et al. | |

* cited by examiner

STRESS REDUCTION APPARATUS AND METHOD

This application is a divisional of U.S. patent application Ser. No. 13/611,226, entitled "Stress Reduction Apparatus," filed on Sep. 12, 2012, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, three-dimensional integrated circuit devices have emerged as an effective alternative to further reduce the physical size of a semiconductor chip. In a three-dimensional integrated circuit, the packaging is generated on the die with contacts provided by a variety of bumps. Much higher density can be achieved by employing three-dimensional integrated circuit devices. Furthermore, three-dimensional integrated circuit devices can achieve smaller form factors, cost-effectiveness, increased performance and lower power consumption.

A three-dimensional integrated circuit device may comprise a top active circuit layer, a bottom active circuit layer and a plurality of inter-layers. In the three-dimensional integrated circuit, two semiconductor dies may be bonded together through a plurality of bumps and electrically coupled to each other through a plurality of through vias. The bumps and through vias provide an electrical interconnection in the vertical axis of the three-dimensional integrated circuit. As a result, the signal paths between two semiconductor dies are shorter than those in a traditional three-dimensional integrated circuit device in which different semiconductor dies are bonded together using interconnection technologies such as wire bonding based chip stacking packages. A three-dimensional integrated circuit device may comprise a variety of semiconductor dies stacked together. The multiple semiconductor dies are packaged before the wafer has been diced.

The three-dimensional integrated circuit technology has a variety of advantages. One advantageous feature of packaging multiple semiconductor dies at the wafer level is multi-chip wafer level package techniques may reduce fabrication costs. Another advantageous feature of wafer level package based multi-chip semiconductor devices is that parasitic losses are reduced by employing bumps and through vias.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a stress reduction apparatus of a three dimensional integrated circuit. The disclosure may also be applied, however, to a variety of semiconductor devices. Hereinafter, various embodiments will be explained in detail with reference to the accompanying drawings.

Figure 1:
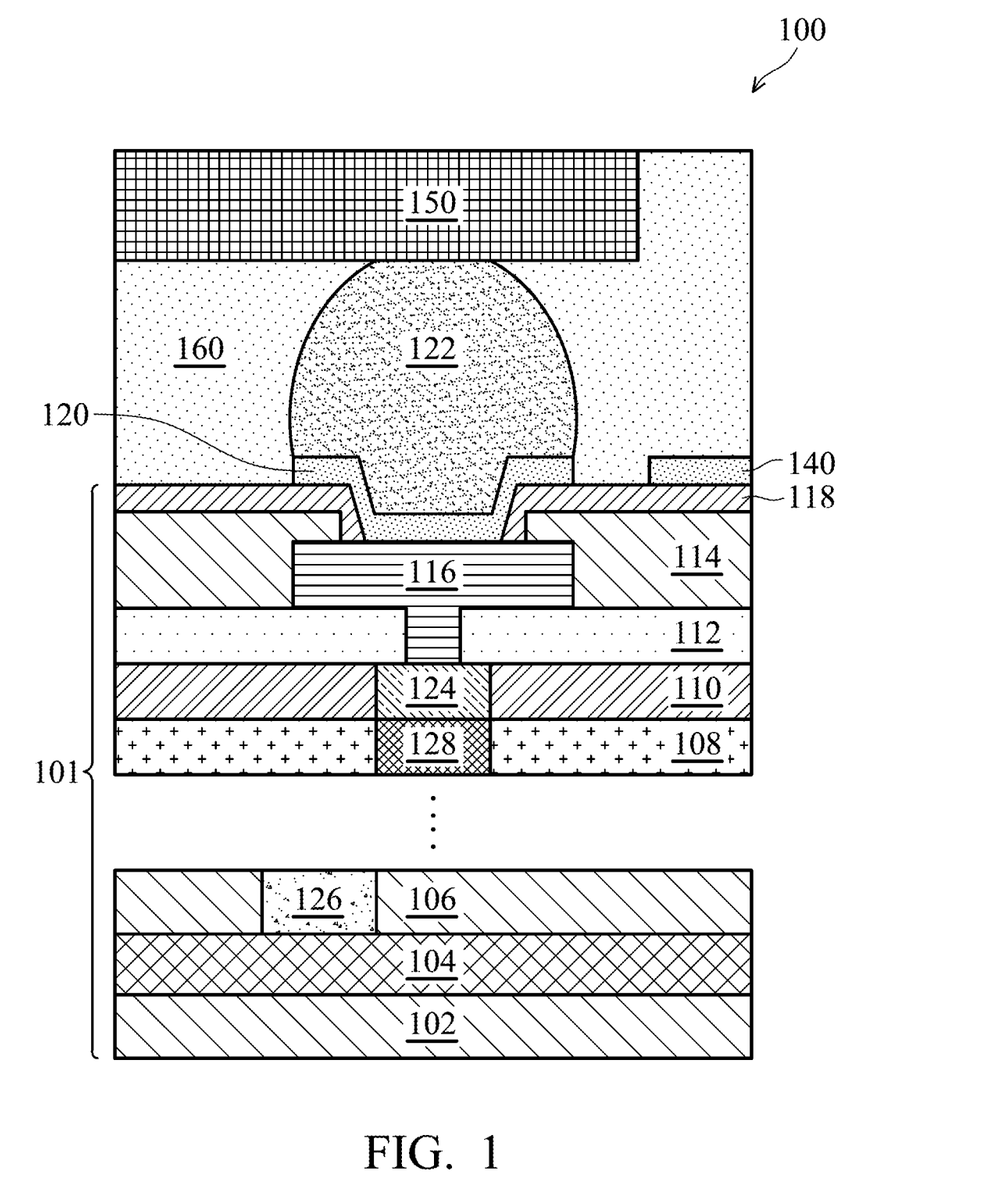
FIG. 1 illustrates a cross sectional view of a three dimensional integrated circuit having dummy conductive planes in accordance with an embodiment.

FIG. 1 illustrates a cross sectional view of a three dimensional integrated circuit having dummy conductive planes in accordance with an embodiment. As shown in FIG. 1, the three dimensional integrated circuit 100 includes a first semiconductor die 101 and a second semiconductor die 150 stacked on top of the first semiconductor die 101. The second semiconductor die 150 may be of a structure similar to the first semiconductor die 101. For simplicity, only the detailed structure of the first semiconductor die 101 is illustrated in FIG. 1 to show innovative aspects of various embodiments.

The first semiconductor die 101 comprises a substrate 102. The substrate 102 may be formed of silicon, although it may also be formed of other group III, group IV, and/or group V elements, such as silicon, germanium, gallium, arsenic, and combinations thereof. The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits (not shown). The electrical circuits formed on the substrate 102 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like.

One of ordinary skill in the art will appreciate that the above examples are provided for illustrative purposes only to further explain applications of the present disclosure and are not meant to limit the present disclosure in any manner.

An interlayer dielectric layer 104 is formed on top of the substrate 102. The interlayer dielectric layer 104 may be formed, for example, of a low-K dielectric material, such as silicon oxide. The interlayer dielectric layer 104 may be formed by any suitable method known in the art, such as spinning, chemical vapor deposition (CVD) and plasma enhanced chemical vapor deposition (PECVD). It should also be noted that one skilled in the art will recognize that the interlayer dielectric layer 104 may further comprise a plurality of dielectric layers.

A bottom metallization layer 106 and a top metallization layer 108 are formed over the interlayer dielectric layer 104. As shown in FIG. 1, the bottom metallization layer 106 comprises a first metal line 126. Likewise, the top metallization layer 108 comprises a second metal line 128. Metal lines 126 and 128 are formed of metal materials such as copper or copper alloys and the like. The metallization layers 106 and 108 may be formed through any suitable techniques (e.g., deposition, damascene and the like). Generally, the one or more inter-metal dielectric layers and the associated metallization layers are used to interconnect the electrical circuits in the substrate 102 to each other to form functional circuitry and to further provide an external electrical connection.

It should be noted while FIG. 1 shows the bottom metallization layer 106 and the top metallization layer 108, one skilled in the art will recognize that one or more inter-metal dielectric layers (not shown) and the associated metallization layers (not shown) are formed between the bottom metallization layer 106 and the top metallization layer 108. In particular, the layers between the bottom metallization layer 106 and the top metallization layer 108 may be formed by alternating layers of dielectric (e.g., extremely low-k dielectric material) and conductive materials (e.g., copper).

A dielectric layer 110 is formed on top of the top metallization layer 108. As shown in FIG. 1, a top metal connector 124 is embedded in the dielectric layer 110. In particular, the top metal connector provides a conductive channel between the metal line 128 and the electrical connection structure of the semiconductor device. The top metal connector 124 may be made of metallic materials such as copper, copper alloys, aluminum, silver, gold and any combinations thereof. The top metal connector 124 may be formed by suitable techniques such as CVD. Alternatively, the top metal connector 124 may be formed by sputtering, electroplating and the like.

A first passivation layer 112 is formed on top of the dielectric layer 110. In accordance with an embodiment, the first passivation layer 112 is formed of non-organic materials such as un-doped silicate glass, silicon nitride, silicon oxide and the like. Alternatively, the first passivation layer 112 may be formed of low-k dielectric such as carbon doped oxide and the like. In addition, extremely low-k (ELK) dielectrics such as porous carbon doped silicon dioxide can be employed to form the first passivation layer 112. The first passivation layer 112 may be formed through any suitable techniques such as CVD. As shown in FIG. 1, there may be an opening formed in the first passivation layer 112. The opening is used to accommodate the bond pad 116, which will be discussed in detail below.

A second passivation layer 114 is formed on top of the first passivation layer 112. The second passivation layer 114 may be similar to the first passivation layer 112, and hence is not discussed in further detail to avoid unnecessary repetition. As shown in FIG. 1, a bond pad 116 is formed in the openings of the first passivation and second passivation layers. The bond pad 116 may be made of metallic materials such as copper, copper alloys, aluminum, silver, gold and any combinations thereof, and/or multi-layers thereof. The bond pad 116 may be formed by suitable techniques such as CVD. Alternatively, the bond pad 116 may be formed by sputtering, electroplating and/or the like.

The bond pad 116 may be enclosed by the first and second passivation layers 112 and 114. In particular, a bottom portion of the bond pad 116 is embedded in the first passivation layer 112 and a top portion of the bond pad 116 is embedded in the second passivation layer 114. The first and second passivation layers 112 and 114 overlap and seal the edges of the bond pad 116 so as to improve electrical stability by preventing the edges of the bond pad 116 from corrosion. In addition, the passivation layers may help to reduce the leakage current of the semiconductor device.

A polymer layer 118 is formed on top of the second passivation layer 114. The polymer layer 118 may be made of polymer materials such as epoxy, polyimide, polybenzoxazole (PBO), silicone, benzocyclobutene (BCB), molding compounds and/or the like. In accordance with various embodiments, the polymer layer 118 may be formed of PBO. For simplicity, throughout the description, the polymer layer 118 may be alternatively referred to as the PI layer 118. The polymer layer 118 may be made by suitable deposition methods known in the art such as spin coating and/or the like.

A redistribution layer (not shown) may be formed in the three dimensional integrated circuit 100 if the bond pad 116 is relocated to a new location. The redistribution layer provides a conductive path between the metal lines (e.g., metal line 128) and the redistributed bond pad. The operation principles of redistribution layers are well known in the art, and hence are not discussed in detail herein.

The PI layer 118 is patterned to form a plurality of openings. Furthermore, various under bump metal (UBM) structures (e.g., UBM 120) are formed on top of the openings. The UBM structures (e.g., UBM 120) are employed to connect the bond pads (e.g., bond pad 116) with various input and output terminals (e.g., connector 122). The UBM structures may be formed by any suitable techniques such as electroplating. Other processes of formation such as sputtering, evaporation, PECVD and the like may alternatively be used depending upon the desired materials.

As shown in FIG. 1, there may be a plurality of dummy conductive planes 140 formed on top of the PI layer 118. The dummy conductive planes 140 are placed between the UBM structures 120 and the edge of the first semiconductor die 101. In accordance with an embodiment, the dummy conductive planes 140 may be formed of copper. The shape and location of the dummy conductive planes 140 will be described in detail below with respect to FIG. 2.

The Connector 122 is formed on top of the UBM structure 120. In accordance with an embodiment, the connector 122 may be a solder ball. The solder ball 122 may be made of any of suitable materials. In accordance with an embodiment, the solder ball 122 may comprise SAC405. SAC405 comprises 95.5% Sn, 4.0% Ag and 0.5% Cu.

In accordance with an embodiment, the connector 122 may be a copper bump. The copper bump may be of a height of approximately 45 um. In accordance with an embodiment, a variety of semiconductor packaging technologies such as sputtering, electroplating and photolithography can be employed to form the copper bump. As known in the art, in order to insure the reliable adhesion and electrical continuity between the copper bump and the bond pad 116, additional layers including a barrier layer, an adhesion layer and a seed layer may be formed between the copper bump and the bond pad 116. It should be noted that the connectors shown in FIG. 1 are merely an example. The disclosure is applicable to a variety of semiconductor connectors.

An underfill material layer 160 may be formed in the gap between the top surface of the first semiconductor die 101 and the second semiconductor die 150. In accordance with an embodiment, the underfill material 160 may be an epoxy, which is dispensed at the gap between the top surface of the first semiconductor die 101 and the second semiconductor die 150. The epoxy may be applied in a liquid form, and may harden after a curing process.

In accordance with another embodiment, the underfill material layer 160 may be formed of curable materials such as polymer based materials, resin based materials, polyimide, epoxy and any combinations of thereof. The underfill material layer 160 can be formed by a spin-on coating process, dry film lamination process and/or the like. An advantageous feature of having an underfill material (e.g., underfill material 160) is that the underfill material 160 helps to prevent the three dimensional integrated circuit 100 from cracking during reliability tests such as thermal cycling processes. In addition, another advantageous feature is that the underfill material 160 may help to reduce the mechanical and thermal stresses during the fabrication process of the three dimensional integrated circuit 100.

Figure 2:
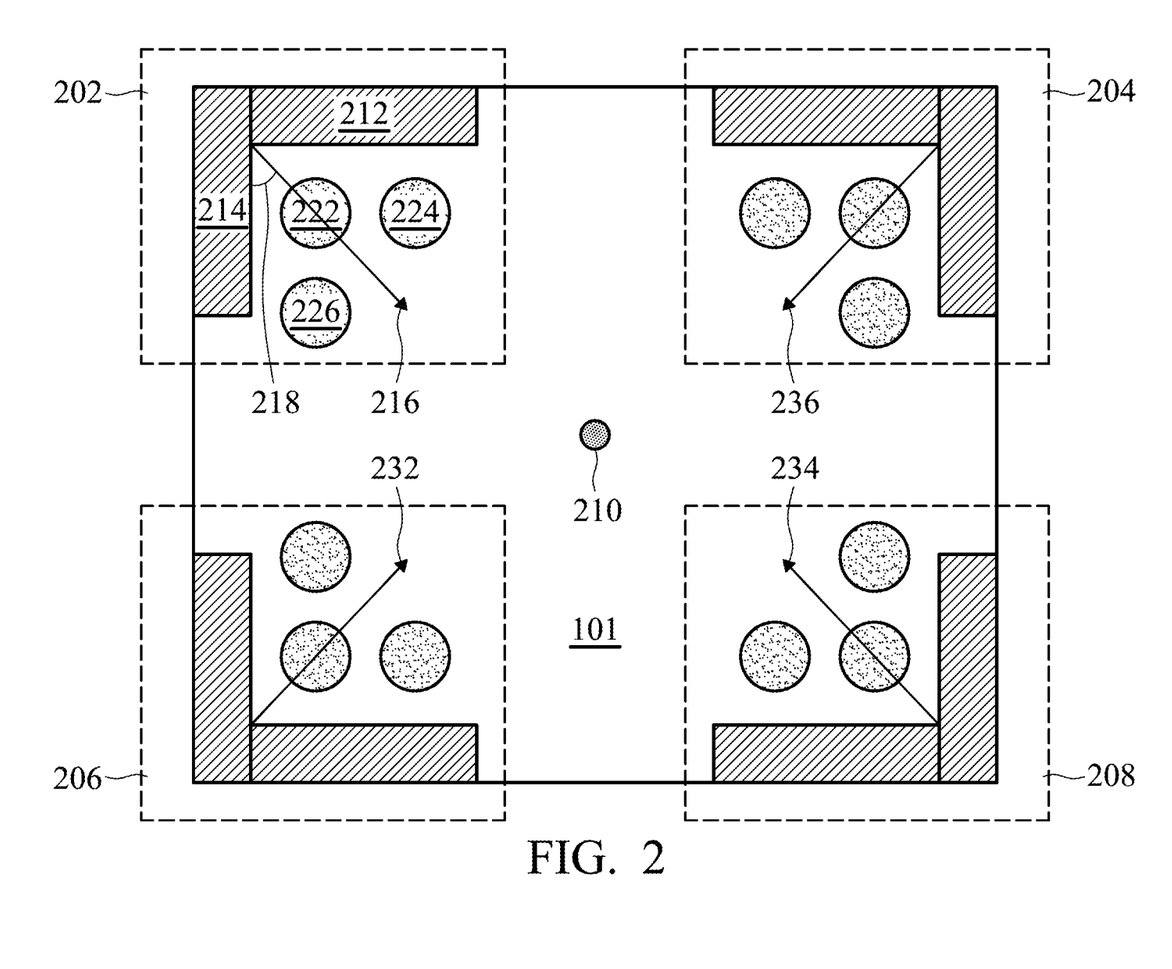
FIG. 2 illustrates a top view of an uppermost surface of the first semiconductor die shown in FIG. 1 in accordance with an embodiment.

FIG. 2 illustrates a top view of an uppermost surface of the first semiconductor die shown in FIG. 1 in accordance with an embodiment. As shown in FIG. 2, the top surface of the first semiconductor die 101 may include four corners, namely corners 202, 204, 206 and 208. There may be a plurality of connectors (e.g., connectors 222, 224 and 226) placed between four corners. In consideration with mechanical strength and design for manufacturing, the connectors (e.g., connector 222) may not be placed adjacent to the edges of the first semiconductor die 101. Instead, a plurality of dummy copper planes (e.g., dummy copper planes 212 and 214) may be placed between the connectors (e.g., connectors 222, 224 and 226) and the edges of the first semiconductor die 101.

The center point of the top surface of the first semiconductor die 101 is referred to as a center point 210. A first Distance to Neutral Point (DNP) direction 216 is defined as a direction from an upper left corner (e.g., corner 202) of the top surface of the first semiconductor die 101 to the center point 210 of the first semiconductor die 101. The starting point of the first DNP direction 216 is the turning point between the dummy copper plane 212 and the dummy copper plane 214.

Likewise, as shown in FIG. 2, a second DNP direction 232 is defined as a direction from the bottom left corner (e.g., corner 206) of the top surface of the first semiconductor die 101 to the center point 210 of the first semiconductor die 101. The starting point of the second DNP direction 232 is the turning point between the dummy copper planes of the bottom left corner. A third DNP direction 234 is defined as a direction from the bottom right corner (e.g., corner 208) of the top surface of the first semiconductor die 101 to the center point 210 of the first semiconductor die 101. The starting point of the third DNP direction 234 is the turning point between the dummy copper planes of the bottom right corner. A fourth DNP direction 236 is defined as a direction from the upper right corner (e.g., corner 204) of the top surface of the first semiconductor die 101 to the center point 210 of the first semiconductor die 101. The starting point of the fourth DNP direction 236 is the turning point between the dummy copper planes of the upper right corner.

In accordance with an embodiment, in order to reduce the stress of the region adjacent to the connectors (e.g., connector 222), the shape and location of dummy conductive planes (e.g., dummy conductive plane 214) are subject to the following restriction. That is, a DNP direction and the outer edge of its adjacent dummy conductive plane may form an angle, which is less than or equal to 45 degrees. For example, in the upper left corner 202, there may be two dummy conductive planes 212 and 214. The outer edge of the dummy conductive plane 214 and the first DNP direction 216 form an angle 218. In accordance with an embodiment, the angle 218 may be approximately equal to 45 degrees. Alternatively, the angle 218 may be less than 45 degrees.

In a semiconductor device having conventional dummy conductive planes, the angle (e.g., 90 degrees) between the outer edge of a dummy conductive plane and its corresponding DNP direction may exaggerate the stress surrounding the connector adjacent to the dummy conductive plane during thermal cycles or other reliability tests. In particular, the thermal expansion effect during thermal cycles may cause a variety of stresses including tensile stress, compressive stress and/or the like. Such stresses, especially the stress adjacent to the corners of the semiconductor device may cause a variety of corner cracks in the underfill layer over the corners of the semiconductor device. The cracks may extend through the underfill layer and further induce cracks on and in the substrate.

One advantageous feature of having the angle shown in FIG. 2 is that the angle requirement between the dummy conductive plane and the DNP direction helps to reduce the stress so as to prevent corner cracks from occurring.

Figure 3:
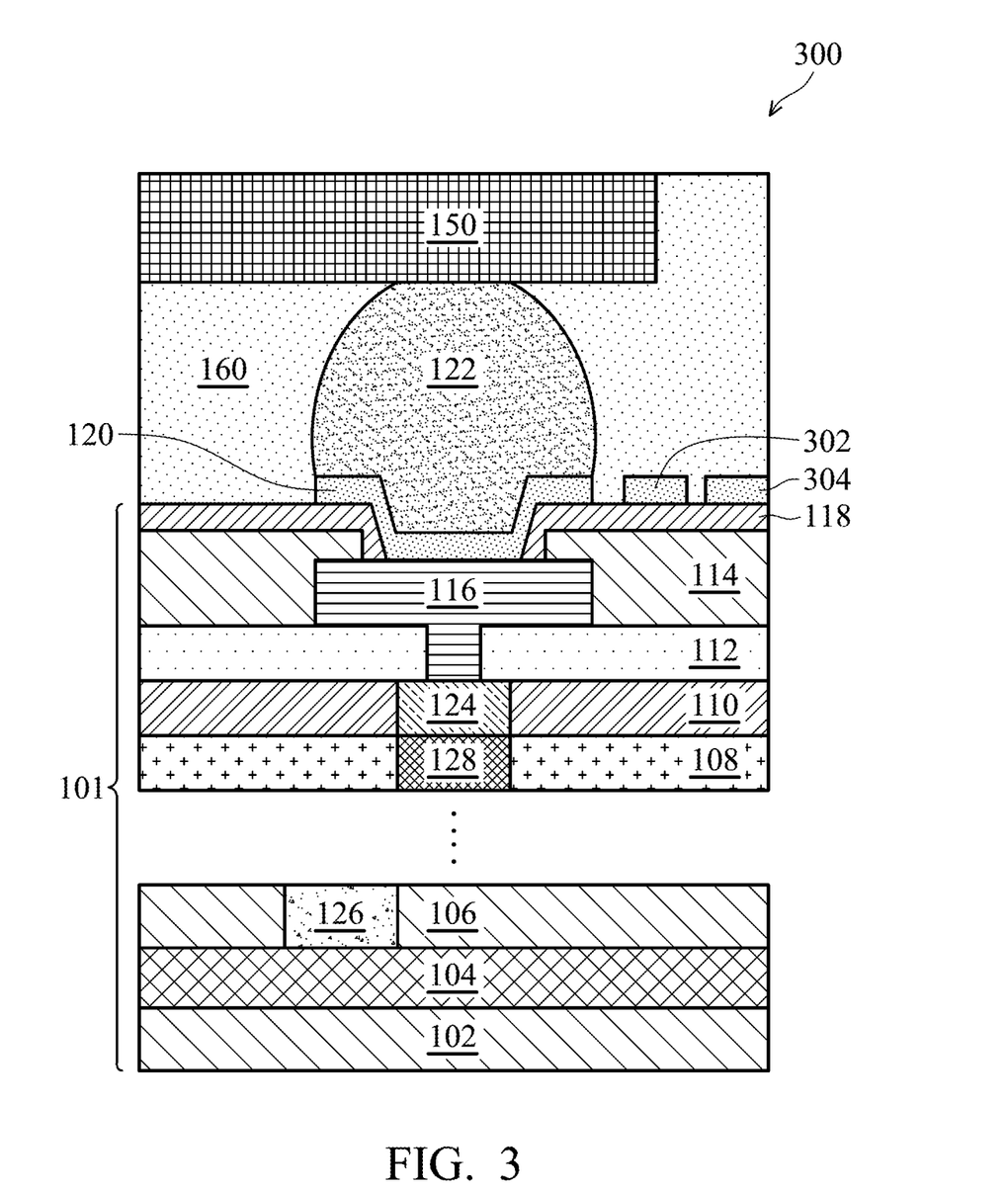
FIG. 3 illustrates a cross sectional view of a three dimensional integrated circuit having dummy conductive planes in accordance with another embodiment.

FIG. 3 illustrates a cross sectional view of a three dimensional integrated circuit having dummy conductive planes in accordance with another embodiment. The three dimensional integrated circuit 300 is similar to the three dimensional integrated circuit 100 shown in FIG. 1 except that the dummy conductive plane 140 shown in FIG. 1 can be replaced by a plurality of dummy conductive planes (e.g., dummy conductive planes 302 and 304). As shown in FIG. 3, there may be two dummy conductive planes placed adjacent to the edge of the first semiconductor die 101. Each dummy conductive plane (e.g., dummy conductive plane 302) may be of a length in range from about 20 um to about 500 um. It should be noted while FIG. 3 shows two dummy conductive planes, the three dimensional integrated circuit 300 may accommodate any number of dummy planes.

Figure 4:
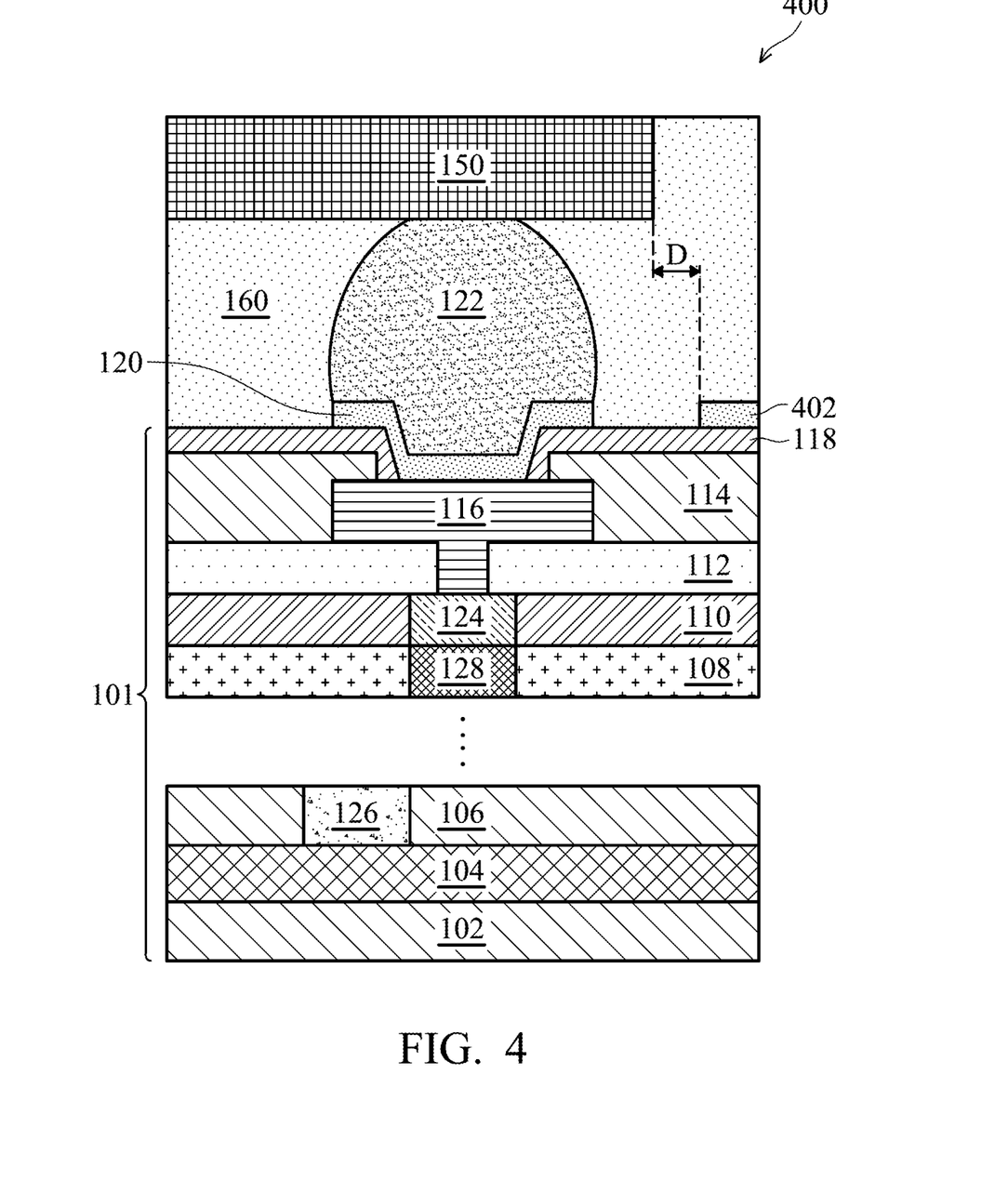
FIG. 4 illustrates a cross sectional view of a three dimensional integrated circuit having dummy conductive planes in accordance with yet another embodiment.

FIG. 4 illustrates a cross sectional view of a three dimensional integrated circuit having dummy conductive planes in accordance with yet another embodiment. The three dimensional integrated circuit 400 is similar to the three dimensional integrated circuit 100 shown in FIG. 1 except that there may be a keep-out zone between the dummy conductive plane 402 and the right edge of the second semiconductor die 150. As shown in FIG. 4, the keep-out zone between the dummy conductive plane 402 and the right edge of the second semiconductor die 150 is defined as D. In accordance with an embodiment, D is greater than 50 um.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
depositing a protection layer over a first substrate, wherein the first substrate is a part of a first semiconductor die;
forming an under bump metallization structure over the protection layer;
forming a connector over the under bump metallization structure;
forming a first dummy plane horizontally over a top surface of the first semiconductor die and along a first edge of the top surface of the first semiconductor die, wherein the first dummy plane has a long side and a short side, and wherein an outermost edge of the long side of the first dummy plane is vertically aligned with the first edge of the top surface of the first semiconductor die; and
forming a second dummy plane horizontally along a second edge of the top surface of the first semiconductor die, wherein the first dummy plane and the second dummy plane form an L-shaped region, wherein the first dummy plane and the second dummy plane form a triangular corner region, and wherein the connector is located in the triangular corner region.

2. The method of claim 1, wherein:
the first dummy plane and the second dummy plane are in direct contact with the protection layer.

3. The method of claim 1, wherein:
the first dummy plane and the second dummy plane are rectangular in shape.

4. The method of claim 1, wherein:
the first dummy plane and the second dummy plane are formed of copper.

5. The method of claim 1, further comprising:
forming a third dummy plane between the first dummy plane and the connector.

6. The method of claim 1, further comprising:
depositing an underfill layer over the first semiconductor die, wherein the first dummy plane and the second dummy plane are embedded in the underfill layer.

7. The method of claim 6, further comprising:
stacking a second semiconductor die over the first semiconductor die, wherein a top surface of the second semiconductor die is level with a top surface of the underfill layer.

8. The method of claim 7, wherein:
an edge of the first dummy plane is separated from an edge of the second semiconductor die by a horizontal distance, and wherein the horizontal distance is greater than 50 um.

9. A method comprising:
forming a plurality of interconnect structures over a substrate of a first semiconductor die;
depositing a protection layer over the substrate;
forming a connector over the protection layer;
forming a plurality of L-shaped dummy conductive regions on a top surface of the protection layer and fully occupying four corners of the top surface of the protection layer, wherein corners of the plurality of L-shaped dummy conductive regions are aligned with respective corners of the top surface of the protection layer, wherein a long edge of a top surface of each of the plurality of L-shaped dummy conductive regions is vertically aligned with a respective edge of a top surface of the first semiconductor die, and wherein the connector is located in a triangular region formed by an L-shaped dummy conductive region of the plurality of L-shaped dummy conductive regions; and
stacking a second semiconductor die on the first semiconductor die, wherein the second semiconductor die is connected to the first semiconductor die through the connector.

10. The method of claim 9, wherein:
the interconnect structures comprise a plurality of dielectric layers and metal lines.

11. The method of claim 9, further comprising
forming an underfill layer between the first semiconductor die and the second semiconductor die, wherein the connector and the plurality of L-shaped dummy conductive regions are embedded in the underfill layer.

12. The method of claim 9, further comprising:
forming an under bump metallization structure over the protection layer; and
forming the connector over the under bump metallization structure.

13. A method comprising:
depositing a protection layer over a first substrate of a semiconductor die;
forming an under bump metallization structure over the protection layer;
forming a connector over the under bump metallization structure;
forming a first dummy plane over the protection layer, wherein an outermost edge of a long side of the first dummy plane is collinear with an edge of the semiconductor die in a plan-view; and
forming a second dummy plane adjacent to the first dummy plane, wherein the first dummy plane and the second dummy plane have a common node at a corner of the first substrate, wherein the first dummy plane and the second dummy plane form an angle approximately equal to 90 degrees, wherein the first dummy plane and the second dummy plane form a triangular corner region, and wherein the connector is located in the triangular corner region.

14. The method of claim 13, wherein:
the first dummy plane and the second dummy plane form an L-shaped dummy region along edges of the first substrate.

15. The method of claim 13, where:
forming a third dummy plane between the first dummy plane and the connector.

16. The method of claim 13, further comprising:
attaching a second substrate on the first substrate through a reflow process, wherein the second substrate is coupled to the first substrate through the connector.

17. The method of claim 16, wherein:
the first dummy plane is separated from the second substrate by a horizontal distance greater than 50 um.

18. The method of claim 1, wherein the protection layer comprises a polymer material.

19. The method of claim 9, wherein the connector comprises a solder ball.

20. The method of claim 16, further comprising:
forming an underfill material between the first substrate and the second substrate, wherein the underfill material is in physical contact with a sidewall of the second substrate.

\* \* \* \* \*

UNITED STATES PATENT AND TRADEMARK OFFICE
CERTIFICATE OF CORRECTION

| | | |
|---|---|---|
| PATENT NO. | : 10,692,848 B2 | Page 1 of 1 |
| APPLICATION NO. | : 15/018340 | |
| DATED | : June 23, 2020 | |
| INVENTOR(S) | : Yao-Chun Chuang et al. | |

It is certified that error appears in the above-identified patent and that said Letters Patent is hereby corrected as shown below:

On the Title Page

Item (72) Inventors, Lines 3-4, delete "Chita Chuang, Hsin-Chu (TW)" and insert --Chita Chuang, Kaohsiung City (TW)--.

Signed and Sealed this
Tenth Day of November, 2020

Andrei Iancu
*Director of the United States Patent and Trademark Office*